(12) United States Patent
Hiraga

(10) Patent No.: US 7,948,078 B2
(45) Date of Patent: May 24, 2011

(54) SEMICONDUCTOR DEVICE

(75) Inventor: Noriaki Hiraga, Kyoto (JP)

(73) Assignee: Rohm Co., Ltd. (JP)

( * ) Notice: Subject to any disclaimer, the term of this patent is extended or adjusted under 35 U.S.C. 154(b) by 701 days.

(21) Appl. No.: 11/880,669

(22) Filed: Jul. 24, 2007

(65) Prior Publication Data

US 2008/0023843 A1    Jan. 31, 2008

(30) Foreign Application Priority Data

Jul. 25, 2006   (JP) .................................. 2006-201538
Jul. 25, 2006   (JP) .................................. 2006-201540

(51) Int. Cl.
*H01L 23/48* (2006.01)

(52) U.S. Cl. . 257/724; 257/723; 257/784; 257/E23.032; 257/E23.033; 257/E23.044; 257/E25.015; 257/E25.025; 361/734

(58) Field of Classification Search .................. 257/723, 257/E23.032, E23.033, 724, 784, E23.044, 257/E25.015, E25.025; 361/734
See application file for complete search history.

(56) References Cited

U.S. PATENT DOCUMENTS

| | | | | |
|---|---|---|---|---|
| 4,042,952 A | * | 8/1977 | Kraybill | 257/724 |
| 4,168,507 A | * | 9/1979 | Yester, Jr. | 257/531 |
| 5,103,283 A | * | 4/1992 | Hite | 257/724 |
| 5,635,751 A | * | 6/1997 | Ikeda et al. | 257/584 |
| 6,022,759 A | * | 2/2000 | Seki et al. | 438/123 |
| 6,340,839 B1 | * | 1/2002 | Hirasawa et al. | 257/672 |

FOREIGN PATENT DOCUMENTS

JP    2002-231875    8/2002

OTHER PUBLICATIONS

Chinese Office Action for Chinese Application No. 200510007933.4 issued May 12, 2010 with English translation.
Chinese Office Action for Chinese Application No. CN 20071013734.8 issued Nov. 29, 2010 with English translation.

* cited by examiner

*Primary Examiner* — Eugene Lee
*Assistant Examiner* — Peniel M Gumedzoe
(74) *Attorney, Agent, or Firm* — Cantor Colburn LLP

(57) ABSTRACT

A semiconductor device has a package structure provided with leads that are external connection terminals. A base substance is an island, and at least the surface thereof is formed of a conductive material. A semiconductor substrate is mounted on the surface of the base substance, and a ground potential is supplied from the surface of the base substance. A shunt capacitor is provided with an electrode pair of a first electrode and a second electrode formed in parallel, and mounted with the first electrode being electrically connected to the surface of the base substance. An internal bonding wire connects a pad provided on the semiconductor substrate for external connection, to the second electrode of the shunt capacitor. The lead is the external connection terminal of the semiconductor device. An external bonding wire connects the lead to the second electrode of the shunt capacitor.

1 Claim, 6 Drawing Sheets

SEMICONDUCTOR DEVICE

BACKGROUND OF THE INVENTION

1. Field of the Invention

The present invention relates to a semiconductor device having a configuration in which a semiconductor element and a chip component are mounted on inner leads, and the resultant structure is sealed with a molding resin.

2. Description of the Related Art

A semiconductor device having a quad flat package (referred to as QFP) structure or the like includes a semiconductor chip on which an integrated circuit is formed and a conductor called as a lead frame. The semiconductor chip is mounted on an island of the lead frame, and pads provided on the semiconductor chip are connected to leads via bonding wires; and then, the resultant structure is sealed with a molding resin. After that, a semiconductor package is separated from the lead frame.

[Patent Document 1] Japanese Patent Application Laid-open No. 2002-231875.

The case where a power supply circuit such as a linear regulator (three terminal regulator) is manufactured as a semiconductor device having the QFP structure will be considered. In this case, a linear regulator stabilizes a power supply voltage input to an input terminal, and outputs the same from an output terminal. Such linear regulator is generally provided with a stabilizing capacitor placed between a power supply terminal and a ground, and between the output terminal and the ground in order to stabilize voltage. Furthermore, in in-vehicle application or the like, there is a case where a decoupling capacitor having several nF to several ten nF in capacitance value is provided in parallel with the stabilizing capacitor in order to comply with a standard called as electro-magnetic compatibility (referred to as EMC).

In a regulator of the QFP structure, the decoupling capacitor needs to be provided on a PCB (Printed Circuit Board), outside the QFP. Therefore, there is a problem in that decoupling characteristics deteriorate by a parasitic inductance and a parasitic resistance caused by leads and a wiring pattern on the PCB, and EMC characteristics of the linear regulator vary due to the wiring pattern on the PCB.

Such problem, that is, the problem that the characteristics of the semiconductor device are affected by the wiring pattern on the PCB to which the semiconductor device is mounted is likely to be generated irrespective of the EMC characteristics.

SUMMARY OF THE INVENTION

The present invention is made in view of the foregoing, and a general purpose of the present invention is to provide a semiconductor device which can suppress the influence of the wiring pattern on the PCB, and obtain stable characteristics.

According to a certain embodiment of the present invention, there is provided a semiconductor device provided with a lead. The semiconductor device includes a base substrate of which at least the surface is formed of a conductive material; a semiconductor substrate which is mounted on one side of the base substrate, and to which a ground potential is supplied from the base substrate; a capacitor provided with an electrode pair of first and second electrodes formed in parallel, the capacitor being mounted on the base substrate in a state where the first electrode is electrically connected to the one side of the base substrate; a first bonding wire which connects a pad provided on the semiconductor substrate for external connection, to the second electrode of the capacitor; a lead which is an external connection terminal of the semiconductor device; and a second bonding wire which connects the lead to the second electrode of the capacitor.

According to this embodiment, the same potential as that of the semiconductor device is supplied to the first electrode of the capacitor via the surface of the base substrate. As a result, as compared with the case where the capacitor is provided outside the package of the semiconductor device, that is, on the PCB as in the conventional way, a relative position between the capacitor and the semiconductor chip is fixed, and therefore, characteristics of the semiconductor device can be stabilized.

According to also another embodiment of the present invention, there is provided a semiconductor device provided with a lead. The semiconductor device includes a base substrate of which at least the surface is formed of a conductive material; a semiconductor substrate which is mounted on one side of the base substrate, and to which a ground potential is supplied from the base substrate; a capacitor provided with an electrode pair of first and second electrodes formed in parallel, the capacitor being mounted on the base substrate in a state where the first electrode is electrically connected to the one side of the base substrate; a lead which is an external connection terminal of the semiconductor device, one end of the lead being closely contacted to the second electrode of the capacitor; and a bonding wire which connects a pad provided on the semiconductor substrate for external connection, to the one end of the lead.

Also according to this embodiment, the same potential as that of the semiconductor device is supplied to the first electrode of the capacitor via the surface of the base substrate. As a result, as compared with the case where the capacitor is provided outside the package of the semiconductor device, that is, on the PCB as in the conventional way, a relative position between the capacitor and the semiconductor chip is fixed, and therefore, characteristics of the semiconductor device can be stabilized.

In a certain embodiment, the semiconductor substrate may include a power supply circuit. The pad may be an input terminal which supplies a power supply voltage to the power supply circuit; and the capacitor may be a decoupling capacitor provided at the input terminal of the power supply circuit.

In addition, the pad may be an output terminal from which a voltage generated by the power supply circuit is output; and the capacitor may be a decoupling capacitor provided at the output terminal of the power supply circuit. The power supply circuit may be a linear regulator.

According to another embodiment of the present invention, there is provided a semiconductor device which includes a base substrate formed with first and second electrodes on the upper surface thereof, the first electrode being grounded; a semiconductor substrate which is mounted on the first electrode of the base substrate, and to which a ground potential is supplied from the first electrode of the base substrate; and a bonding wire which connects a pad provided on the semiconductor substrate for external connection, to the second electrode of the base substrate. The base substrate is formed of dielectric material, a plurality of electrodes are laminated inside thereof with a dielectric layer being sandwiched, and the first electrode and the second electrode are connected to the laminated electrodes, respectively, thereby constituting a capacitor.

The capacitor formed inside the base substrate serves as a shunt capacitor provided between the first electrode and the ground. According to this embodiment, the shunt capacitor can be incorporated in a package of the semiconductor device, and characteristics thereof can be stabilized.

In a certain embodiment, the semiconductor device may further include a lead provided as an external connection terminal. The second electrode may also be formed on the undersurface of the base substrate in a shape connectable to one end of the lead; and the one end of the lead may be connected to the second electrode. Furthermore, the second electrode formed on the undersurface of the base substrate may have a shape which is substantially the same as the one end of the lead.

In a certain embodiment, the semiconductor device may further include an island provided as an external connection terminal which is for grounding. The first electrode may also be formed on the undersurface of the base substrate; and the island may be connected to the first electrode formed on the undersurface of the base substrate.

In further another embodiment, the semiconductor device may further include an island provided as an external connection terminal which is for grounding; and a lead provided as an external connection terminal. Such configuration may be employed that the first electrode is also formed on the undersurface of the base substrate; the second electrode is also formed on the undersurface of the base substrate in a shape connectable to one end of the lead; and the island and the lead are integrally formed as a lead frame, and the island and the lead are connected to the first electrode and the second electrode, respectively, and then cut.

According to this embodiment, a capacitor can be suitably incorporated in the lead frame package.

In a certain embodiment, such configuration may be employed that the base substrate is provided with a plurality of the second electrodes, which are insulated with each other, formed on the upper surface thereof; the bonding wire is provided for each of the second electrodes, and is connected to the pad corresponding to each of the second electrodes; and the plurality of the second electrodes serve as a plurality of capacitors provided in parallel, using the first electrode as a common grounding terminal.

According to this embodiment, a plurality of second electrodes are formed at the positions where capacitors need to be provided; and accordingly, the second electrodes can be suitably arranged just proximal to the positions where a shunt capacitor needs to be provided in an integrated circuit formed on the semiconductor substrate.

In a certain embodiment, the semiconductor substrate may include a power supply circuit. Such configuration may be employed that the pad is an input terminal which supplies a power supply voltage to the power supply circuit; and the capacitor is a decoupling capacitor provided at the input terminal of the power supply circuit.

In addition, such configuration may be employed that the pad is an output terminal from which a voltage generated by the power supply circuit is output; and the capacitor is a decoupling capacitor provided at the output terminal of the power supply circuit. The power supply circuit may be a linear regulator.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

The invention will now be described based on preferred embodiments which do not intend to limit the scope of the present invention but exemplify the invention. All of the features and the combinations thereof described in the embodiment are not necessarily essential to the invention.

First Embodiment

Figure 1:
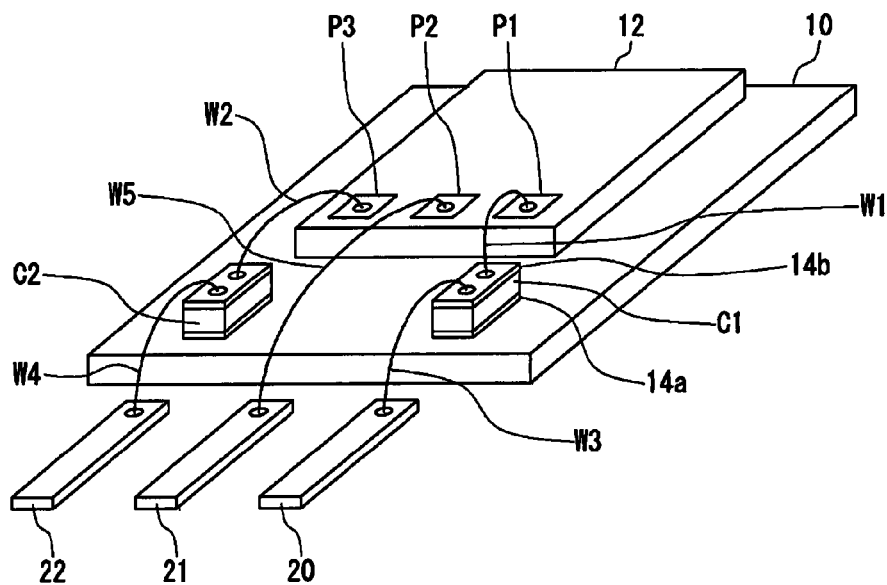
FIG. 1 is a perspective view of a semiconductor device according to a first embodiment.

FIG. 1 is a perspective view of a semiconductor device 100 according to a first embodiment of the present invention. The semiconductor device 100 is configured by a lead frame package. The semiconductor device 100 includes a base substrate 10, a semiconductor substrate 12, shunt capacitors C1 and C2, internal bonding wires W1 and W2, external bonding wires W3 and W4, a direct bonding wire W5, and lead electrodes (merely called as lead below) 20 to 22. In fact, the semiconductor device 100 is sealed with a molding resin; however, in order to clarify an internal structure, the molding resin is not shown.

At least the surface of the base substrate 10 is formed of a conductive material. The "surface" in this case represents only one side of the base substrate 10, or both sides thereof. The base substrate 10 is a member which corresponds to an island of a lead frame. In the present embodiment, the base substrate 10 is formed of metal as a whole as in the island of the lead frame, and the base substrate 10 itself is a conductor.

The semiconductor substrate 12 is mounted on the surface (upper surface) of the base substrate 10, and a ground voltage that is a fixed voltage is supplied from the surface of the base substrate 10. Transistor elements, resistors, capacitors and the like are integrated on the upper surface of the semiconductor substrate 12, and a functional circuit is formed. In the present embodiment, a power supply circuit is formed in the semiconductor substrate 12.

The shunt capacitors C1 and C2 are provided with an electrode pair of a first electrode 14a and a second electrode 14b formed in parallel on the undersurface and the upper surface thereof. The structure of the shunt capacitors C1 and C2 should not be recognized as a general or a known structure. A capacitor commercially available as a known chip component has two electrodes arranged on both ends of a mounting side being in contact with a substrate, a base substrate, a PCB, or the like which are to be mounted; whereas, the shunt capacitors C1 and C2 of the present embodiment has electrodes formed on both sides, the mounting side and the side opposite thereto. In addition, an internal configuration of the shunt capacitors C1 and C2 is the same as that of a general laminated ceramic capacitor.

The shunt capacitor C1 has a first electrode 14a mounted by being electrically connected to the surface of the base substrate 10. Solder that is general connecting means can be used for connection. The connection of the shunt capacitor C2 is also the same.

Pads P1 to P3 for outside connection are provided on the surface on which an integrated circuit of the semiconductor substrate 12 is formed. An internal bonding wire W1 connects the pad P1 to the second electrode 14b of the shunt capacitor C1. Similarly, an internal bonding wire W2 connects the pad P3 to the second electrode of the shunt capacitor C2. The bonding wire is a gold wire, for example.

The leads 20 to 22 serve as external connection terminals of the semiconductor device 100. It is preferable that the leads 20 to 22 are formed of the same material as that of the base substrate 10. The leads and the base substrate 10 that is the island are integrally formed as the lead frame and sealed with the molding resin, and then cut.

The external bonding wire W3 connects the lead 20 to the second electrode 14b of the shunt capacitor C1. Similarly, the external bonding wire W4 connects the lead 22 to the second electrode of the shunt capacitor C2. The direct bonding wire W5 directly connects the pad P2 to which the shunt capacitor is not connected, to the lead 21.

Figure 2:
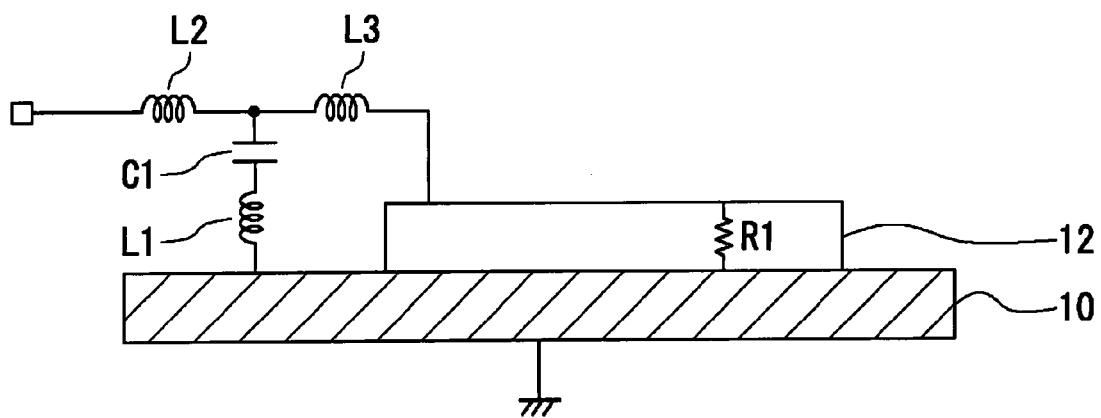
FIG. 2 is a view showing a sectional view of the semiconductor device shown in FIG. 1 as an equivalent circuit diagram.

FIG. 2 is a view showing a sectional view of the semiconductor device 100 shown in FIG. 1 as an equivalent circuit diagram. FIG. 2 is the sectional view of a plane including the shunt capacitor C1, the internal bonding wire W1, and the external bonding wire W3 shown in FIG. 1. Reference symbols L1 shown in FIG. 2 denotes a series parasitic inductance of the shunt capacitor C1 shown in FIG. 1; L2 denotes a parasitic inductance of the external bonding wire W3 and the lead 20 shown in FIG. 1; and L3 denotes an inductance of the internal bonding wire W1 shown in FIG. 1. In addition, a resistor R1 shown in FIG. 2 denotes a resistance component in the thickness direction of from the undersurface (backside) of the semiconductor substrate 12 to the upper surface (surface) where a semiconductor integrated circuit is formed. For example, the resistor R1 is a resistance component of a p-type silicon substrate.

The base substrate 10 is directly connected to the PCB with solder, and fixed to a ground potential. Therefore, in this case, it assumes that an ideal ground condition is realized in the base substrate 10. In the structure shown in FIG. 1, the first electrode 14a of the shunt capacitor C1 is directly connected to the base substrate 10 which is in the ideal ground condition without via the bonding wire and a wiring. As a result, the inductance component L1 existing in a path in series with the shunt capacitor C1 is only a parasitic inductance of the shunt capacitor C1 itself, and is a very small as compared with an inductance of a bonding wire and a general wiring on the PCB. For example, an inductance component of the bonding wire and the wiring on the PCB is several nH; whereas, a parasitic inductance component of a capacitor of 0603 standard (600 μm×300 μm×300 μm) is small as much as 1 nH or less, which is small.

Therefore, according to the semiconductor device 100 of the present embodiment, a series inductance component of the shunt capacitor C1 provided between a power supply line and the ground, or between a signal line and the ground can be reduced as compared with conventional technology. Furthermore, since the shunt capacitor C1 is mounted at a predetermined position on the base substrate 10, a variation and fluctuation in the inductance component L1 is suppressed, as compared with the case where the shunt capacitor C1 is mounted on the PCB.

As a result, according to the semiconductor device 100 of the present embodiment, the series inductance component of the shunt capacitor C1 is reduced and a fluctuation of the value is suppressed; and therefore, circuit characteristics can be stabilized. The shunt capacitor is used as a decoupling capacitor provided between the power supply line and the ground, or used for an LC filter and an RC filter. In these applications, the series inductance component of the shunt capacitor is reduced and; and accordingly, characteristics of the circuit can be improved. In addition, the variation in the inductance component is suppressed; and accordingly, a variation in the circuit characteristics can be suppressed.

Needless to say, the above consideration is also applicable to the shunt capacitor C2.

Figure 3:
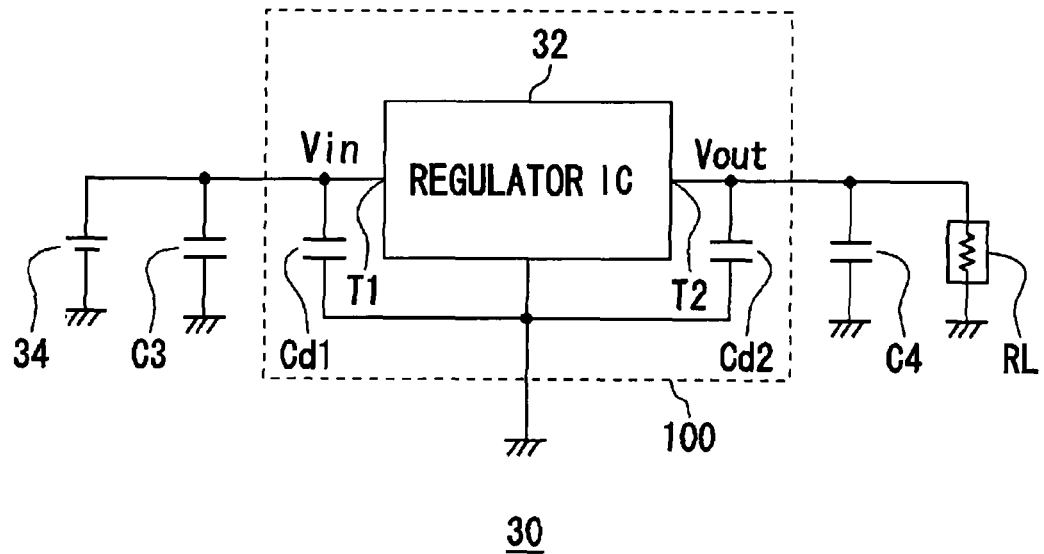
FIG. 3 is a circuit diagram of a power supply circuit for which a structure of the semiconductor device shown in FIG. 1 is suitably available.

FIG. 3 is a circuit diagram of a power supply circuit 30 for which the structure of the semiconductor device 100 shown in FIG. 1 is suitably available. The power supply circuit 30 includes a regulator IC 32, decoupling capacitors Cd1 and Cd2, and stabilizing (smoothing) capacitors C3 and C4. The regulator IC 32 is integrated in the semiconductor substrate 12 shown in FIG. 1. The regulator IC is a general three terminal regulator circuit including a reference voltage source, an operational amplifier, and a power transistor (not shown in the Figure); and an input voltage Vin output from a DC power supply 34 is applied to an input terminal T1. The power transistor is provided between the input terminal T1 and an output terminal T2 of the regulator IC 32. An output voltage Vout of the output terminal T2 is feedback to a noninversion input terminal of the operational amplifier, and a reference voltage is applied to an inversion input terminal. The output voltage of the operational amplifier is applied to a control terminal of the power transistor, that is, a base or a gate. On-resistance of the power transistor is controlled, and the output voltage Vout is stabilized.

The smoothing capacitor C3 is provided on the input terminal T1 side of the regulator IC 32, and the smoothing capacitor C4 is provided on the output terminal T2 side. For example, a capacitance value of the smoothing capacitor C3 on the input side is approximately several hundred nF, and a capacitance value of the smoothing capacitor C4 on the output side is several ten to several hundred μF. Fluctuations in the input voltage Vin and the output voltage Vout are suppressed by these smoothing capacitors C3 and C4; and therefore, a stable voltage can be supplied to a load RL. Furthermore, the decoupling capacitor Cd1 is provided on the input terminal T1 side of the regulator IC 32, and the decoupling capacitor Cd2 is provided on the output terminal T2 side. Capacitance values of the decoupling capacitors Cd1 and Cd2 are several to several ten nF, which are provided in order to improve EMC characteristics. In the present embodiment, the decoupling capacitor Cd1 and the decoupling capacitor Cd2 shown in FIG. 3 are provided inside the semiconductor device 100 as the shunt capacitors C1 and C2 shown in FIG. 1.

The decoupling capacitors Cd1 and Cd2 shown in FIG. 3 are mounted inside the semiconductor device 100 as the shunt capacitors C1 and C2 shown in FIG. 1; and accordingly, good decoupling characteristics can be realized. Even in the case where a very high level is required as EMC such as in-vehicle application, the level can be cleared.

In addition, there has been a problem in that the EMC characteristics vary due to a wiring pattern on the PCB in the case where the decoupling capacitors Cd1 and Cd2 are arranged on the PCB as in the conventional way; however, if the structure shown in FIG. 1 is adopted, mounting positions of the decoupling capacitors Cd1 and Cd2 are fixed, and therefore, the EMC characteristics can be stabilized irrespective of outside factors.

Furthermore, the capacitors previously provided outside the semiconductor package, that is, provided on the PCB is provided inside the semiconductor package; and accordingly, the number of components and a circuit area on the system can be reduced.

Second Embodiment

Figure 4:
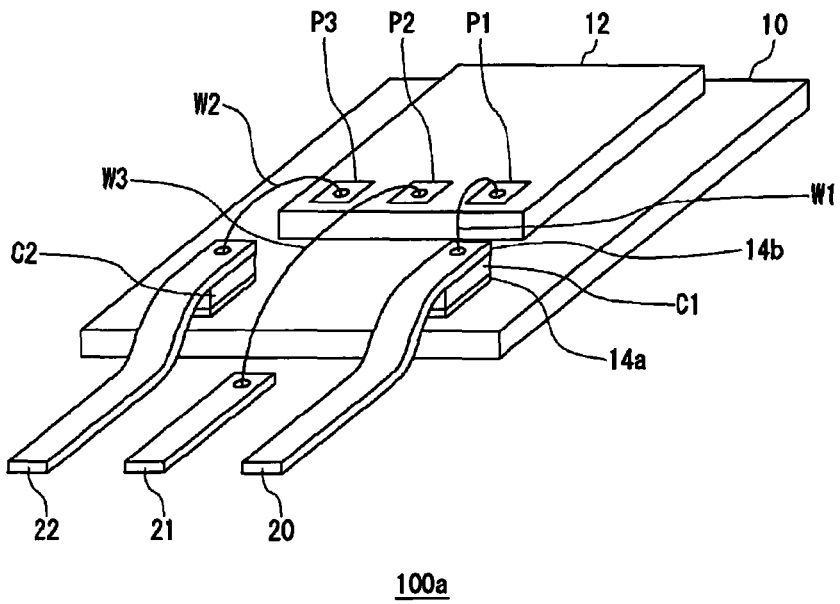
FIG. 4 is a perspective view of a semiconductor device according to a second embodiment.

FIG. 4 is a perspective view of a semiconductor device 100a according to a second embodiment. A structure of the semiconductor device 100a according to the second embodiment will be described below covering mainly the different points from the semiconductor device 100 shown in FIG. 1. In a semiconductor device 100a shown in FIG. 4, a connection configuration of a pad P1, a shunt capacitor C1, a lead 20, and an internal bonding wire W1 is different from that of the semiconductor device 100 shown in FIG. 1.

In the semiconductor device 100a shown in FIG. 4, a lead 20 is formed in a folded shape, extended so as to cover over the second electrode 14b of the shunt capacitor C1, and directly connected to the second electrode 14b of a shunt capacitor C1 without via a bonding wire. Furthermore, the pad P1 of a semiconductor substrate 12 is connected to the lead 20 via the internal bonding wire W1. In addition, a shunt capacitor C2 is also connected in the same way as the shunt capacitor C1.

In also the semiconductor device 100a according to the second embodiment, the first electrode 14a of the shunt capacitor C1 is connected to a base substrate 10 which is in an ideal ground condition, without via a wiring and the bonding wire. Therefore, a series inductance component of the shunt capacitor C1 is suppressed, and a fluctuation in an inductance component due to a mounting position is eliminated; and therefore, stable circuit characteristics can be obtained. Consequently, the semiconductor device 100a shown in FIG. 4 is also suitable for a package of the power supply circuit 30 shown in FIG. 3 as in the semiconductor device 100 shown in FIG. 1.

In addition, the lead 20 is directly connected to the shunt capacitor C1 without via the bonding wire; and accordingly, there is an advantage in that the number of the bonding wire can be reduced as compared with the semiconductor device 100 shown in FIG. 1. Since breakage of the bonding wire is likely to be occurred, reduction in the number causes improvement in yields.

It is to be understood to those skilled in the art that the description of the above embodiment is made by way of example, various modifications are possible in the combination of their respective constituent elements and respective processes, and such modifications also fall within the scope of the present invention.

In the embodiment, the case where the undersurface of the semiconductor substrate 12, that is, the backside on which an integrated circuit is not formed is connected to the base substrate 10, and a ground potential is supplied to the integrated circuit of the upper surface (surface) via a semiconductor substrate 12; however, in place of this, or in addition to this, a grounding pad may be provided on the upper surface of the semiconductor substrate 12, and the pad may be connected to the base substrate 10 via the bonding wire.

In the embodiment, the case where two shunt capacitors are mounted on the base substrate 10 as shown in FIG. 1 and FIG. 4 is described; however, the present invention is not limited to this, but, many further shunt capacitors may be mounted on the base substrate 10 according to circuit applications.

In the embodiment, an example of a circuit integrated in the semiconductor substrate 12 is described using a linear regulator; however, the present invention is not limited to this, but, the present invention can also be suitably used for other power supply circuit such as a switching regulator and a charge pump circuit. In these circuits, since the power supply circuit itself generates switching noise, the decoupling capacitors Cd1 and Cd2 are provided at terminals where direct current voltage, that is, an input voltage and an output voltage appear; and, this may be mounted as the shunt capacitors C1 and C2 shown in FIG. 1 or FIG. 4. In this case, it is possible to suitably prevent switching noise from leaking to the outside.

In addition, in the preferred embodiment, the case where the decoupling capacitor which is for blocking the noise is mounted on the base substrate 10 is described; but, the present invention is not limited to this. As described above, the shunt capacitor for use in an RC filter, an LC filter, and the like is mounted on the base substrate 10; and accordingly, a frequency characteristic and a Q value can be stabilized.

Third Embodiment

Figure 5:
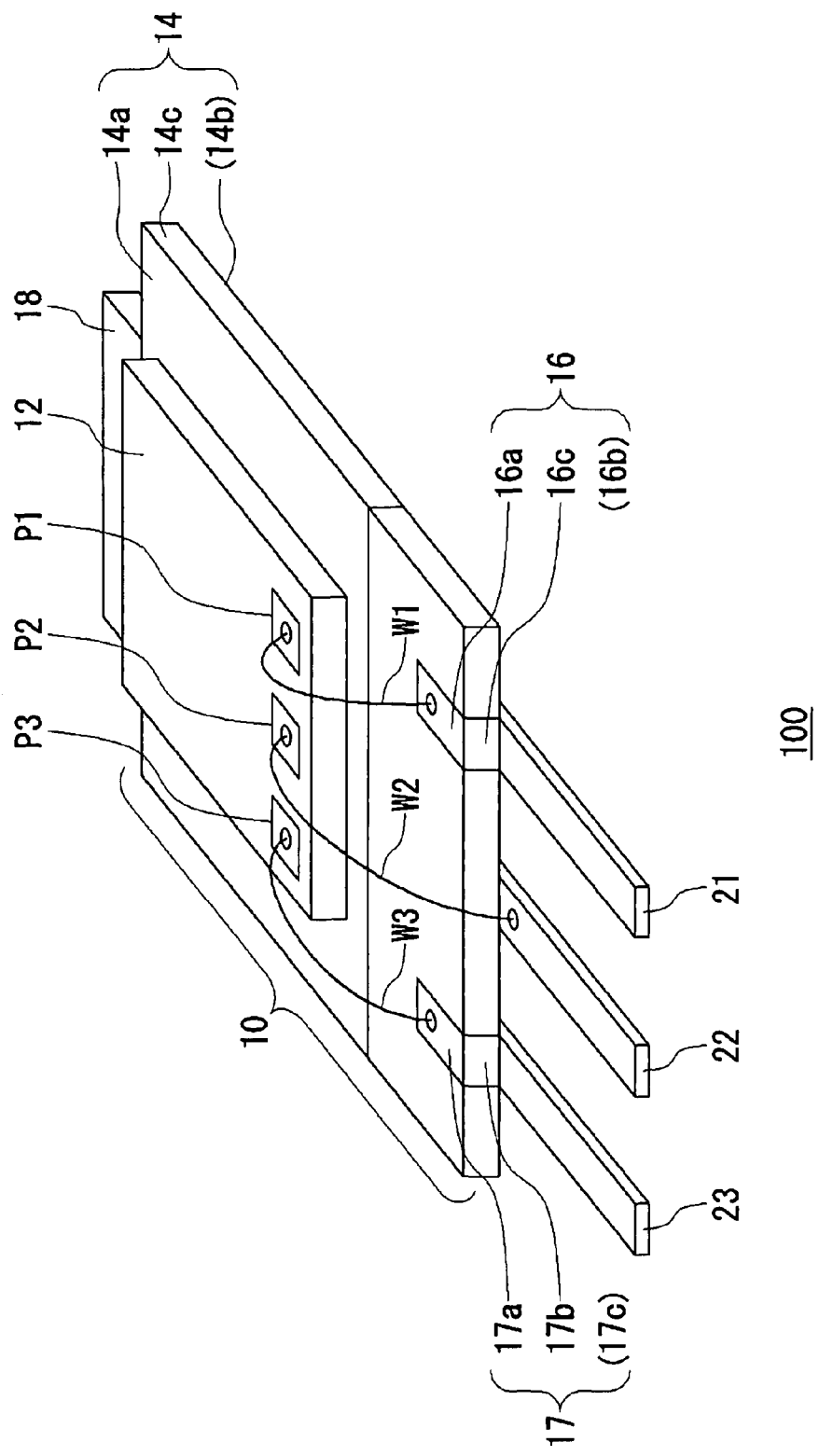
FIG. 5 is a perspective view of a semiconductor device according to a third preferred embodiment.

FIG. 5 is a perspective view of a semiconductor device 100 according to a third preferred embodiment of the present invention. The semiconductor device 100 is configured by a lead frame package. The semiconductor device 100 includes a base substrate 10, a semiconductor substrate 12, lead electrodes (merely referred to as lead below) 21 to 23, an island 18, and bonding wires W1 to W3. The bonding wire is a gold wire, for example. In fact, the semiconductor device 100 is sealed with a molding resin; however, in order to clarify the internal structure, the molding resin is not shown.

The semiconductor substrate 12 is a semiconductor chip in which an integrated circuit is formed. The semiconductor substrate 12 is mounted on a first electrode 14 of the base substrate 10, and a ground potential is supplied from the first electrode 14 of the base substrate 10. In addition, a plurality of pads P1 to P3 which are provided for external connection are provided on the semiconductor substrate 12.

The base substrate 10 is made of a dielectric material whose dielectric constant is high, for example, using ceramics as a main component. The first electrode 14 and a second electrode 16 are formed on the upper surface of the base substrate 10. The upper surface in this case is an upper side in a state where the semiconductor device 100 is mounted on the PCB, that is, the upper surface denotes a side which is not in contact with the PCB; from a different view point, the upper surface denotes a side on which the semiconductor substrate 12 is mounted; or, the upper surface denotes a side opposite to a side on which the leads 21 to 23 and the island 18 are provided (referred to as undersurface below). In the following description, in FIG. 5, the upper side is expressed as the upper surface or the surface, and the lower side is expressed as the undersurface or the backside. In addition, as to be described later, the base substrate 10 itself may have the upper surface and the undersurface which are formed in symmetry. The first electrode 14 is grounded.

A first electrode 14a is formed on the base substrate 10 so as to be overlapped with a mounting position where the semiconductor substrate 12 is located. As shown in FIG. 5, it is desirable that an area of the first electrode 14 is equal to or larger than that of the semiconductor substrate 12. Furthermore, a first electrode 14b which is the same shape as the first electrode 14a is also formed on the undersurface of the base substrate 10, and a side electrode 14c is formed on the side of the base substrate 10 in order to connect first electrodes 14a and 14b formed on the upper surface and the undersurface.

A plurality of second electrodes 16 and 17 are formed on the base substrate 10 in addition to the first electrode 14. The second electrodes 16 and 17 are formed adjacent to the pads P1 and P3 provided on the semiconductor substrate 12, respectively. The pad P1 and the pad P3 are pads where a capacitor provided between each of the pads and the ground (this capacitor is referred to as shunt capacitor below) is connected to a signal line and a power supply line to be connected. The second electrode 16 includes an electrode 16a formed on the upper surface, an electrode 16b formed on the undersurface, and an electrode 16c formed on the side. The second electrode 17 is the same.

The bonding wire W1 connects the pad P1 to the second electrode 16a of the base substrate 10. Similarly, the bonding wire W3 connects the pad P3 to the second electrode 17a of the base substrate 10.

The second electrode 16b formed on the undersurface of the base substrate 10 is formed in a shape connectable to one end of the lead 21, and the one end of the lead 21 and the second electrode 16b are connected with solder or the like. It is desirable that the shape of the second electrode 16b formed on the undersurface of the base substrate 10 is substantially the same as one end of the lead 21. That is, the width of the second electrode 16b is approximately equal to that of the lead 21, and the length of the second electrode 16b is approximately equal to the length in which the lead 21 overlaps the base substrate 10.

The island 18 is provided as an external connection terminal which is for grounding the semiconductor device 100. The first electrode 14b formed also on the undersurface of the base substrate 10 is connected to the island 18.

The semiconductor device 100 is sealed with a resin mold, and the island 18 and the leads 21 to 23 are connected to the PCB as connecting terminals. It is preferable that the island 18 and the leads 21 to 23 are formed of the same material; more preferably, the island 18 and the leads are integrally formed as a lead frame and sealed with the molding resin, and then cut.

As described above, the base substrate 10 is formed of ceramics. A plurality of electrodes are laminated inside the base substrate 10 with ceramics being sandwiched, and the first electrode 14 and the second electrode 16 are connected to the laminated electrodes, respectively; and accordingly, a first shunt capacitor C1 is constituted. Similarly, the first electrode 14 and the second electrode 17 are connected to the laminated electrodes, respectively; and accordingly, a second shunt capacitor C2 is constituted.

The bonding wire W2 directly connects the lead 22 to the pad P2 to which the shunt capacitors C1 and C2 are not connected.

Figure 6:
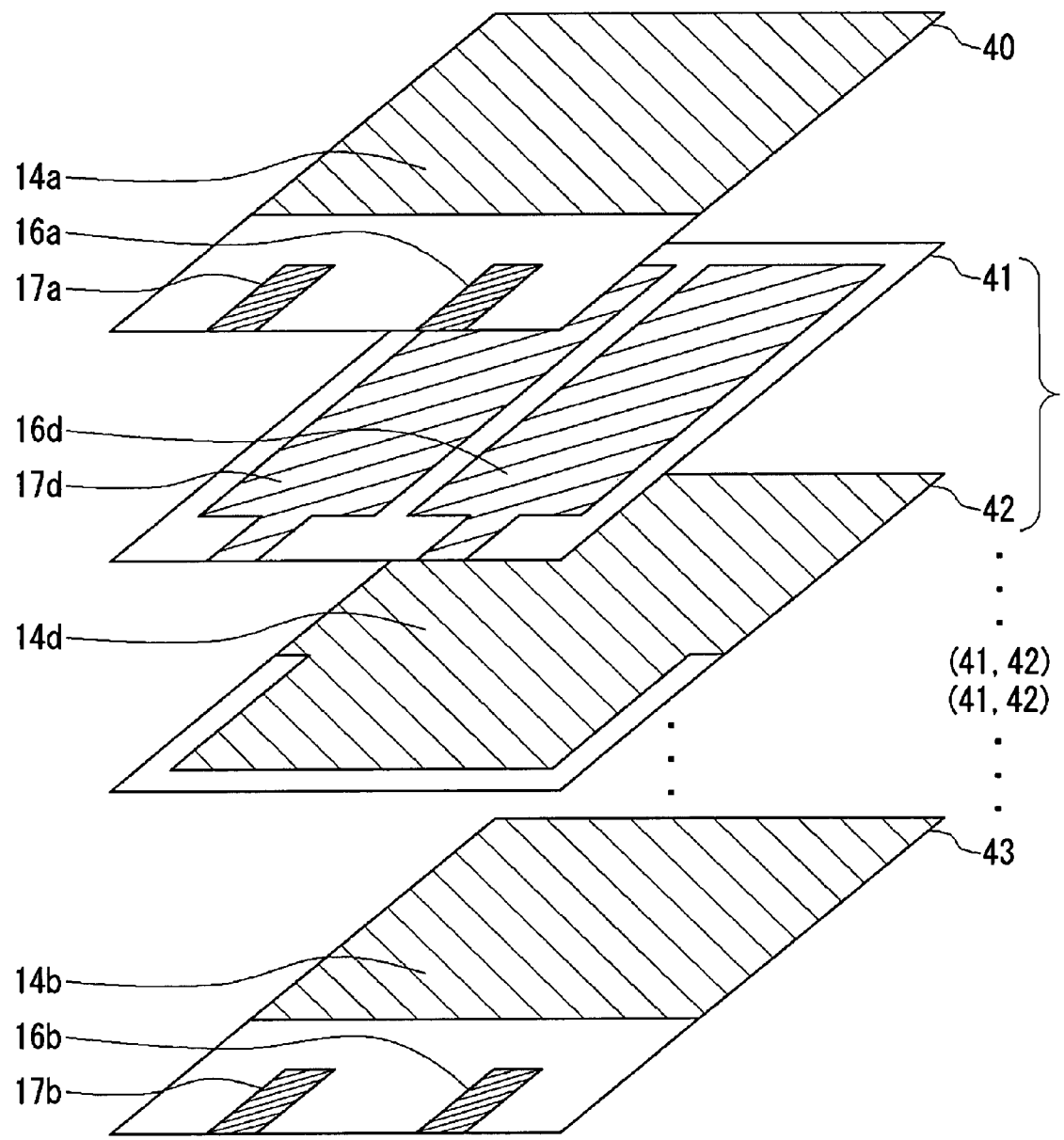
FIG. 6 is a view showing a configuration of a base substrate.

FIG. 6 is a view showing a configuration of the base substrate 10. The base substrate 10 is configured by laminating a plurality of conductor layers (electrode layer) 40 to 43 and an insulation layer (not shown). The insulation layer is preferably ceramics with a high dielectric constant. The conductor layer 40 is formed on the surface of the base substrate 10 shown in FIG. 5, the conductor layer 43 is formed on the backside of the base substrate 10 shown in FIG. 5. Therefore, the conductor layer 40 includes the first electrode 14a, the second electrode 16a, and the second electrode 17a; and the conductor layer 43 includes the first electrode 14b, the second electrode 16b, and the second electrode 17b.

The conductor layer 41 adjacent to the conductor layer 40 includes two electrodes 16d and 17d to be connected to the second electrode 16a and the second electrode 17a. Each of the electrodes 16d and 17d is formed so as to be overlapped with the first electrode 14a of the conductor layer 40. In addition, each part of the electrodes 16d and 17d is in contact with an outer circumference of the conductor layer 40 so as to be connected to the side electrodes 16c and 17c shown in FIG. 5.

The conductor layer 42 is laid on the undersurface of the conductor layer 41. The conductor layer 42 is connected to the first electrode 14a of the conductor layer 40 via the side electrode 14c shown in FIG. 5. That is, the conductor layer 42 is a ground layer. A plurality of conductor layers 41 and 42 are alternately arranged on the lower side of the conductor layer 42. The conductor layer 43 of the lowermost layer has the same electrode pattern as that of the conductor layer 40 of the uppermost layer.

That is, in the base substrate 10 shown in FIG. 6, first electrodes 14a, 14b, and 14d are connected via the side electrode 14c shown in FIG. 5. In addition, the second electrodes 16a, 16b, and 16d are connected via the side electrode 16c shown in FIG. 5; and the second electrodes 17a, 17b, and 17d are connected via the side electrode 17c shown in FIG. 5. The thus configured base substrate 10 includes two capacitors using the first electrode 14 as a common grounding terminal. That is, a first capacitor is formed between the first electrode 14 and the second electrode 16, and a second capacitor is formed between the first electrode 14 and the second electrode 17. For this reason, the base substrate 10 is called as a capacitor plate.

Figure 7A:
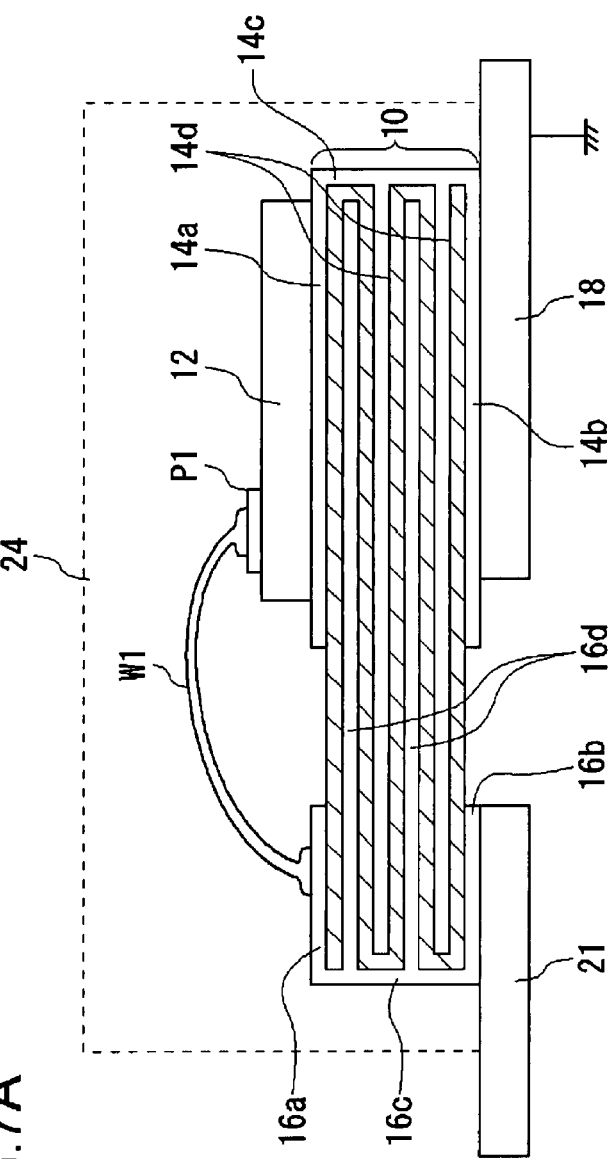
FIGS. 7A and 7B are a sectional view and an equivalent circuit diagram of the semiconductor device shown in FIG. 5, respectively.
Figure 7B:
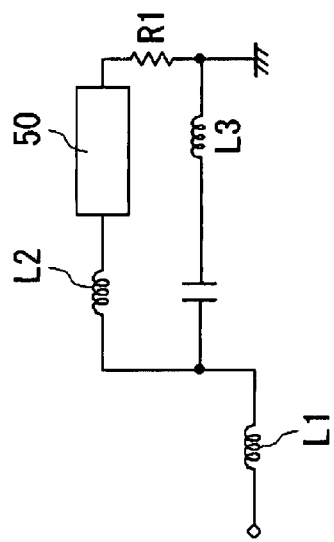

FIGS. 7A and 7B are a sectional view and an equivalent circuit diagram of the semiconductor device 100 shown in FIG. 5. FIG. 7A is the sectional view of a plane including the lead 21, the second electrode 16, and the bonding wire W1 shown in FIG. 5. A molding resin 24 is formed so as to cover over the upper surface of the base substrate 10 and the semiconductor substrate 12. FIG. 7B shows the sectional view shown in FIG. 7A by an equivalent circuit. An integrated circuit 50 shown in FIG. 7B represents a functional circuit formed on the semiconductor substrate 12. An inductance component L1 represents an inductance component of the lead 21 existing between the second electrode 16 and an outside circuit. In addition, an inductance component L2 represents an inductance component existing between the pad P1 on the semiconductor substrate 12 and the second electrode 16. Furthermore, a resistance component R1 represents a resistance component in the thickness direction of from the undersurface (backside) of the semiconductor substrate 12 to the upper surface (surface) on which the semiconductor integrated circuit is formed.

A capacitor C1 represents a capacitor formed between the first electrode 14 and the second electrode 16. As is apparent from the equivalent circuit shown in FIG. 7B, the capacitor C1 serves as a shunt capacitor provided between the signal line and the ground, or between the power supply line and the ground. Similarly, an another shunt capacitor C2 exists in the section including the lead 23, the pad P3, and the bonding wire W3 shown in FIG. 5. An inductance component L3 shown in FIG. 7B represents a series parasitic inductance component existing on the ground side of the shunt capacitor C1.

The thus configured semiconductor device 100 has the following advantages in addition to an advantage that the shunt capacitors provided between the signal line and the ground and provided between the power supply line and the ground can be incorporated in the semiconductor device 100.

In the semiconductor device 100 according to the present embodiment, the island 18 is directly connected to a land pattern on the PCB. Therefore, in this case, it is assumed that an ideal ground condition is realized in the island 18. As a result, the first electrode 14 of the incorporated capacitor C1 is directly connected to the island 18 which is in the ideal ground condition, without via the bonding wire and a wiring; and consequently, the inductance component L3 existing on the grounding terminal side of the shunt capacitor C1 can be considerably reduced. Generally, the inductance component on the grounding terminal side of the shunt capacitor C1 is not preferable because the inductance component makes the ground condition of the capacitor unstable. In the case where the capacitor C1 is provided on the PCB, since the inductance component L3 is formed by the bonding wire and a general wiring on the PCB, the inductance component L3 becomes very large; however, in the semiconductor device 100 according to the present embodiment, the series inductance component of the shunt capacitor provided between the power supply line and the ground, or between the signal line and the ground can be reduced as compared with the previously known technology.

Furthermore, if the shunt capacitor is mounted on the PCB, there is a problem in that the inductance component L3 varies according to the wiring pattern; however, in the present embodiment, the shunt capacitor is mounted on a predetermined position of the base substrate 10, and therefore, a variation and fluctuation in the inductance component L3 is suppressed.

As a result, according to the semiconductor device 100 of the present embodiment, the series inductance component of the shunt capacitor C1 reduces and a fluctuation of the value is suppressed; and therefore, circuit characteristics can be stabilized. The shunt capacitor is used as a decoupling capacitor provided between the power supply line and the ground, or used for an LC filter and an RC filter. In these applications, the series inductance component of the shunt capacitor is reduced; and accordingly, the circuit characteristics can be improved. In addition, the variation in inductance component is suppressed; and accordingly, a variation in the circuit characteristics can be suppressed.

Needless to say, the above consideration is also applicable to the shunt capacitor C2.

Figure 8:
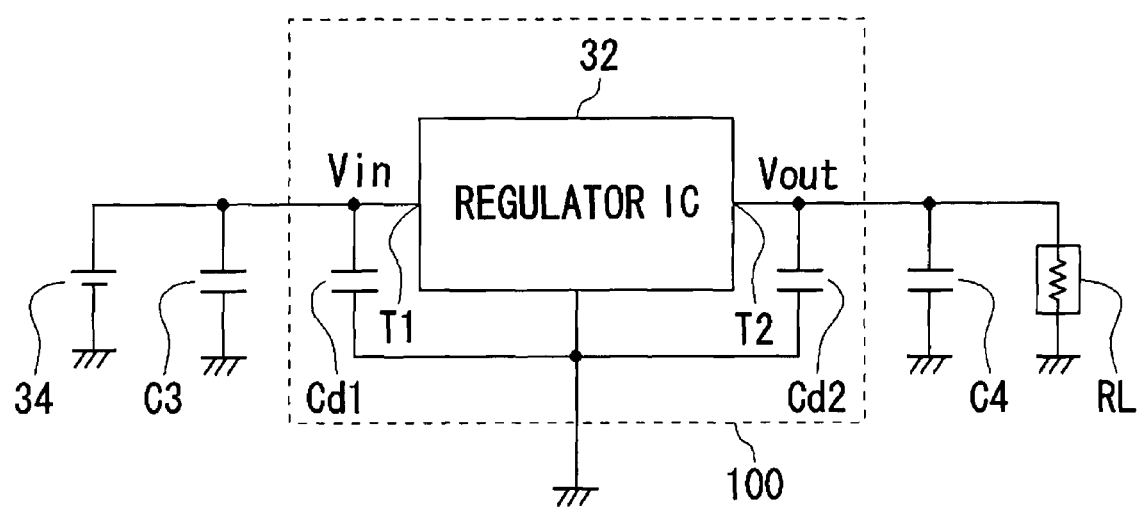
FIG. 8 is a circuit diagram of a power supply circuit for which the semiconductor device shown in FIG. 5 is suitably available.

FIG. 8 is a circuit diagram of a power supply circuit 30 for which the structure of the semiconductor device 100 shown in FIG. 5 is suitably available. The power supply circuit 30 includes a regulator IC 32, decoupling capacitors Cd1 and Cd2, and stabilizing (smoothing) capacitors C3 and C4. The regulator IC 32 is integrated in the semiconductor substrate 12 shown in FIG. 5. The regulator IC is a general three terminal regulator circuit including a reference voltage source, an operational amplifier, and a power transistor; and an input voltage Vin output from a DC power supply 34 is applied to an input terminal T1. The power transistor is provided between the input terminal T1 and an output terminal T2 of the regulator IC 32. An output voltage Vout at the output terminal 12 is feedback to a non-inversion input terminal of the operational amplifier, and a reference voltage is applied to an inversion input terminal. The output voltage of the operational amplifier is applied to a control terminal of the power transistor, that is, a base or a gate. On-resistance of the power transistor is controlled, and the output voltage Vout is stabilized.

The smoothing capacitor C3 is provided on the input terminal T1 side of the regulator IC 32, and the smoothing capacitor C4 is provided on the output terminal T2 side. For example, a capacitance value of the smoothing capacitor C3 on the input side is approximately several hundred nF, and a capacitance value of the smoothing capacitor C4 on the output side is several ten to several hundred μF. Fluctuations in the input voltage Vin and the output voltage Vout are suppressed by these smoothing capacitors C3 and C4; and therefore, a stable voltage can be supplied to a load RL. Furthermore, the decoupling capacitor Cd1 is provided on the input terminal T1 side of the regulator IC 32, and the decoupling capacitor Cd2 is provided on the output terminal T2 side. Capacitance values of the decoupling capacitors Cd1 and Cd2 are several to several ten nF, which are provided in order to improve EMC characteristics. In the present embodiment, the decoupling capacitor Cd1 and the decoupling capacitor Cd2 shown in FIG. 8 are provided inside the base substrate 10 as the capacitors C1 and C2 corresponding to the second electrode 16 and the second electrode 17 shown in FIG. 5.

The decoupling capacitors Cd1 and Cd2 shown in FIG. 8 are configured as the shunt capacitors C1 and C2 incorporated in the base substrate 10; and accordingly, good decoupling characteristics can be realized, and the level can be cleared even in the case where a very high level is required as EMC such as in-vehicle application.

In addition, there has been a problem in that the EMC characteristics vary due to a wiring pattern on the PCB in the case where the decoupling capacitors Cd1 and Cd2 are arranged on the PCB as in the conventional way; however, if the structure shown in FIG. 5 is adopted, mounting positions of the decoupling capacitors Cd1 and Cd2 are fixed, and therefore, the EMC characteristics can be stabilized irrespective of outside factors.

Furthermore, the capacitors previously provided outside the semiconductor package, that is, provided on the PCB is provided inside the semiconductor package; and accordingly, the number of components and a circuit area on the system can be reduced.

It is to be understood to those skilled in the art that the description of the above embodiment is made by way of example, various modifications are possible in the combination of their respective constituent elements and respective treatment processes, and such modifications also fall within the scope of the present invention.

In the semiconductor device 100 shown in FIG. 5, the case where two second electrodes 16 and 17 are provided and two shunt capacitors are incorporated in the base substrate 10; however, the number is not limited to two, but, the second electrodes 16 and 17 may be arranged at a plurality of positions in order to provide more capacitors. In addition, a plurality of second electrodes do not need to be arranged on the same side of the base substrate 10; but, in the semiconductor substrate 12, the second electrodes may be provided adjacent to the pads to which a signal line and a power supply line requiring the shunt capacitors are connected.

In the embodiment, the case where the undersurface of the semiconductor substrate 12, that is, the backside on which an integrated circuit is not formed is connected to the base substrate 10, and a ground potential is supplied to the integrated circuit of the upper surface (surface) via a semiconductor substrate 12; however, in place of this, or in addition to this, a grounding pad may be provided on the upper surface of the semiconductor substrate 12, and the pad may be connected to the base substrate 10 via the bonding wire.

In the embodiment, an example of a circuit integrated in the semiconductor substrate 12 is described using a linear regulator; however, the present invention is not limited to this, but, the present invention can also be suitably used for other power supply circuit such as a switching regulator and a charge pump circuit. In these circuits, since the power supply circuit itself generates switching noise, the decoupling capacitors Cd1 and Cd2 are provided at terminals where direct current voltage, that is, an input voltage and an output voltage appear, which may be mounted as the shunt capacitors C1 and C2 shown in FIG. 5 or FIG. 8. In this case, it is possible to suitably prevent switching noise from leaking to the outside. Furthermore, the integrated circuit is not limited to the power supply circuit, but, the present invention can be used for various applications requiring the shunt capacitor.

In addition, in the preferred embodiment, the case where the decoupling capacitor which is for blocking the noise is mounted on the base substrate 10 is described; but, the present invention is not limited to this. As described above, the shunt capacitor for use in the RC filter, the LC filter, and the like is incorporated in the base substrate 10; and accordingly, a frequency characteristic and a Q value can be stabilized.

The present invention can be applied to any of an analog circuit, a digital circuit, and an analog and digital consolidated circuit, and the semiconductor manufacturing process can be applied to any of a bipolar process, a CMOS process, and a BiCMOS process.

What is claimed is:

1. A power supply device comprising:
a semiconductor device,
the semiconductor device comprising:
a base substrate of which at least the surface is formed of a conductive material;
a semiconductor substrate which is mounted on one side of the base substrate, and on which a first pad, a second pad, and a linear regulator for stabilizing a voltage input to the first pad and outputting the voltage from the second pad are integrated;
a first decoupling capacitor provided with an electrode pair of first and second electrodes formed in parallel, the first decoupling capacitor being mounted on the base substrate in a state where the first electrode is electrically connected to the one side of the base substrate;
a second decoupling capacitor provided with an electrode pair of first and second electrodes formed in parallel, the second decoupling capacitor being mounted on the base substrate in a state where the first electrode is electrically connected to the one side of the base substrate;
a first bonding wire which connects the first pad to the second electrode of the first decoupling capacitor;
a second bonding wire which connects the second pad to the second electrode of the second decoupling capacitor;
a first lead which is an external connection terminal;
a second lead which is an external connection terminal;
a third bonding wire which connects the first lead to the second electrode of the first decoupling capacitor; and
a fourth bonding wire which connects the second lead to the second electrode of the second decoupling capacitor,
the power supply device further comprising:
a first smoothing capacitor provided outside the semiconductor device, connected to the first lead, and having a capacitance value of several ten to several hundred nF; and
a second smoothing capacitor provided outside the semiconductor device, connected to the second lead, and having a capacitance value of several ten to several hundred μF.

* * * * *